US007418543B2

(12) United States Patent
Jain et al.

(10) Patent No.: US 7,418,543 B2
(45) Date of Patent: Aug. 26, 2008

(54) PROCESSOR HAVING CONTENT ADDRESSABLE MEMORY WITH COMMAND ORDERING

(75) Inventors: Sanjeev Jain, Shresbury, MA (US); Gilbert M. Wolrich, Framingham, MA (US); Debra Bernstein, Sudbury, MA (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 11/018,591

(22) Filed: Dec. 21, 2004

(65) Prior Publication Data

US 2006/0136659 A1    Jun. 22, 2006

(51) Int. Cl.
    *G06F 12/00*    (2006.01)
(52) U.S. Cl. ............ 711/108; 711/155; 711/169; 365/49.1; 710/39
(58) Field of Classification Search ........ 710/6, 710/54; 711/108, 141, 143, 151, 155; 714/19
    See application file for complete search history.

(56) References Cited

U.S. PATENT DOCUMENTS

| | | | | |
|---|---|---|---|---|
| 4,561,051 | A | * | 12/1985 | Rodman et al. ........... 711/152 |
| 5,257,218 | A | | 10/1993 | Poon |
| 5,398,244 | A | | 3/1995 | Mathews et al. |
| 5,442,576 | A | | 8/1995 | Gergen et al. |
| 5,455,599 | A | | 10/1995 | Cabral et al. |
| 5,460,349 | A | | 10/1995 | Campbell et al. |
| 5,477,383 | A | | 12/1995 | Jain |
| 5,530,948 | A | * | 6/1996 | Islam .................. 714/6 |
| 5,548,795 | A | * | 8/1996 | Au .................... 710/52 |
| 5,870,625 | A | * | 2/1999 | Chan et al. ............... 710/5 |
| 5,974,525 | A | | 10/1999 | Lin et al. |
| 5,995,967 | A | * | 11/1999 | Iacobovici et al. ........ 707/100 |
| 6,055,579 | A | | 4/2000 | Goyal et al. |
| 6,169,685 | B1 | * | 1/2001 | Gandini et al. ............ 365/49 |
| 6,247,116 | B1 | | 6/2001 | Abdallah et al. |
| 6,263,426 | B1 | | 7/2001 | Abdallah et al. |
| 6,266,769 | B1 | | 7/2001 | Abdallah et al. |
| 6,282,554 | B1 | | 8/2001 | Abdallah et al. |
| 6,292,815 | B1 | | 9/2001 | Abdallah et al. |
| 6,307,789 | B1 | | 10/2001 | Wolrich et al. |
| 6,324,624 | B1 | | 11/2001 | Wolrich et al. |
| 6,427,196 | B1 | | 7/2002 | Adiletta et al. |
| 6,442,697 | B1 | | 8/2002 | Jain et al. |
| 6,463,072 | B1 | | 10/2002 | Wolrich et al. |
| 6,469,925 | B1 | | 10/2002 | Jain |
| 6,480,868 | B2 | | 11/2002 | Abdallah et al. |
| 6,502,115 | B2 | | 12/2002 | Thakkar et al. |
| 6,510,075 | B2 | | 1/2003 | Jain |

(Continued)

OTHER PUBLICATIONS

Adiletta, et al., "The next generation of Intel IXP Network Processors", Intel Technology Journal, Network Processors, vol. 6, issue 3, published Aug. 15, 2002, pp. 16-18.*

(Continued)

*Primary Examiner*—Kevin Ellis
*Assistant Examiner*—Kalpit Parikh
(74) *Attorney, Agent, or Firm*—Daly, Crowley, Mofford & Durkee, LLP

(57) ABSTRACT

A content addressable memory (CAM) includes a linked list structure for a pending queue to order memory commands for maximizing memory channel bandwidth by minimizing read/write stalls due to read-modify-write commands.

25 Claims, 7 Drawing Sheets

U.S. PATENT DOCUMENTS

| Patent No. | Date | Inventor(s) | Ref |
|---|---|---|---|
| 6,532,509 B1 | 3/2003 | Wolrich et al. | |
| 6,549,451 B2 | 4/2003 | Jain | |
| 6,560,667 B1 | 5/2003 | Wolrich et al. | |
| 6,571,333 B1 | 5/2003 | Jain et al. | |
| 6,574,738 B2 | 6/2003 | Jain et al. | |
| 6,577,542 B2 | 6/2003 | Wolrich et al. | |
| 6,584,522 B1 | 6/2003 | Wolrich et al. | |
| 6,587,906 B2 | 7/2003 | Wolrich et al. | |
| 6,598,140 B1* | 7/2003 | McAllister et al. | 711/168 |
| 6,606,704 B1 | 8/2003 | Adiletta et al. | |
| 6,625,654 B1 | 9/2003 | Wolrich et al. | |
| 6,631,430 B1 | 10/2003 | Wolrich et al. | |
| 6,631,462 B1 | 10/2003 | Wolrich et al. | |
| 6,633,987 B2 | 10/2003 | Jain et al. | |
| 6,661,794 B1 | 12/2003 | Wolrich et al. | |
| 6,667,920 B2 | 12/2003 | Wolrich et al. | |
| 6,668,311 B2 | 12/2003 | Hooper et al. | |
| 6,668,317 B1 | 12/2003 | Bernstein et al. | |
| 6,681,300 B2 | 1/2004 | Wolrich et al. | |
| 6,687,246 B1 | 2/2004 | Wolrich et al. | |
| 6,694,380 B1 | 2/2004 | Wolrich et al. | |
| 6,694,397 B2 | 2/2004 | Lackey et al. | |
| 6,728,845 B2 | 4/2004 | Adiletta et al. | |
| 6,738,068 B2 | 5/2004 | Cohen et al. | |
| 6,738,831 B2 | 5/2004 | Wolrich et al. | |
| 6,779,084 B2 | 8/2004 | Wolrich et al. | |
| 6,782,472 B2 | 8/2004 | Jain et al. | |
| 6,792,488 B2 | 9/2004 | Wolrich et al. | |
| 6,819,201 B2 | 11/2004 | Jain | |
| 6,823,438 B2 | 11/2004 | Hooper et al. | |
| 6,829,056 B1 | 12/2004 | Barnes et al. | |
| 6,877,077 B2* | 4/2005 | McGee et al. | 711/158 |
| 2001/0051948 A1 | 12/2001 | Srinivisan et al. | |
| 2002/0006050 A1 | 1/2002 | Jain | |
| 2002/0013861 A1 | 1/2002 | Adiletta et al. | |
| 2002/0038403 A1 | 3/2002 | Wolrich et al. | |
| 2002/0041520 A1 | 4/2002 | Wolrich et al. | |
| 2002/0042150 A1 | 4/2002 | Prestegard et al. | |
| 2002/0049603 A1 | 4/2002 | Mehra et al. | |
| 2002/0049749 A1 | 4/2002 | Helgeson et al. | |
| 2002/0053012 A1 | 5/2002 | Adiletta et al. | |
| 2002/0053016 A1 | 5/2002 | Wolrich et al. | |
| 2002/0053017 A1 | 5/2002 | Adiletta et al. | |
| 2002/0055852 A1 | 5/2002 | Little et al. | |
| 2002/0059559 A1 | 5/2002 | Reddy et al. | |
| 2002/0069121 A1 | 6/2002 | Jain et al. | |
| 2002/0073091 A1 | 6/2002 | Jain et al. | |
| 2002/0081714 A1 | 6/2002 | Jain et al. | |
| 2002/0085008 A1 | 7/2002 | Jain et al. | |
| 2002/0087862 A1 | 7/2002 | Jain et al. | |
| 2002/0091710 A1 | 7/2002 | Dunham et al. | |
| 2002/0106085 A1 | 8/2002 | Jain et al. | |
| 2002/0106845 A1 | 8/2002 | Chao et al. | |
| 2002/0107811 A1 | 8/2002 | Jain et al. | |
| 2002/0111731 A1 | 8/2002 | Jain et al. | |
| 2002/0123749 A1 | 9/2002 | Jain | |
| 2002/0126621 A1 | 9/2002 | Johnson et al. | |
| 2002/0143665 A1 | 10/2002 | Santos et al. | |
| 2002/0144039 A1 | 10/2002 | Lackey et al. | |
| 2002/0154610 A1 | 10/2002 | Tiedemann et al. | |
| 2002/0161889 A1 | 10/2002 | Gamache et al. | |
| 2002/0167834 A1 | 11/2002 | Jain | |
| 2002/0167835 A1 | 11/2002 | Jain | |
| 2002/0167836 A1 | 11/2002 | Jain | |
| 2002/0167837 A1 | 11/2002 | Jain | |
| 2002/0167845 A1 | 11/2002 | Jain | |
| 2002/0169445 A1 | 11/2002 | Jain et al. | |
| 2002/0169935 A1* | 11/2002 | Krick et al. | 711/167 |
| 2002/0172210 A1 | 11/2002 | Wolrich et al. | |
| 2002/0176290 A1 | 11/2002 | Jain | |
| 2002/0178229 A1 | 11/2002 | Sinha et al. | |
| 2002/0184352 A1 | 12/2002 | Jain et al. | |
| 2002/0186657 A1 | 12/2002 | Jain et al. | |
| 2002/0188884 A1 | 12/2002 | Jain et al. | |
| 2002/0193118 A1 | 12/2002 | Jain et al. | |
| 2002/0194560 A1 | 12/2002 | Jain et al. | |
| 2003/0004688 A1 | 1/2003 | Gupta et al. | |
| 2003/0004689 A1 | 1/2003 | Gupta et al. | |
| 2003/0004720 A1 | 1/2003 | Garudadri et al. | |
| 2003/0009699 A1 | 1/2003 | Gupta et al. | |
| 2003/0014662 A1 | 1/2003 | Gupta et al. | |
| 2003/0018677 A1 | 1/2003 | Mathur et al. | |
| 2003/0028578 A1 | 2/2003 | Jain et al. | |
| 2003/0033474 A1* | 2/2003 | Lin | 711/111 |
| 2003/0041082 A1 | 2/2003 | Dibrino | |
| 2003/0041099 A1 | 2/2003 | Kishore et al. | |
| 2003/0041216 A1 | 2/2003 | Rosenbluth et al. | |
| 2003/0041228 A1 | 2/2003 | Rosenbluth et al. | |
| 2003/0046044 A1 | 3/2003 | Jain et al. | |
| 2003/0046488 A1 | 3/2003 | Rosenbluth et al. | |
| 2003/0051073 A1 | 3/2003 | Mishra et al. | |
| 2003/0055829 A1 | 3/2003 | Kambo et al. | |
| 2003/0056055 A1 | 3/2003 | Hooper et al. | |
| 2003/0063517 A1 | 4/2003 | Jain | |
| 2003/0065366 A1 | 4/2003 | Merritt et al. | |
| 2003/0065785 A1 | 4/2003 | Jain | |
| 2003/0079040 A1 | 4/2003 | Jain et al. | |
| 2003/0081582 A1 | 5/2003 | Jain et al. | |
| 2003/0101362 A1 | 5/2003 | Jain et al. | |
| 2003/0101438 A1 | 5/2003 | Mishra et al. | |
| 2003/0105899 A1 | 6/2003 | Rosenbluth et al. | |
| 2003/0105901 A1 | 6/2003 | Wolrich et al. | |
| 2003/0110166 A1 | 6/2003 | Wolrich et al. | |
| 2003/0110322 A1* | 6/2003 | Wolrich et al. | 710/5 |
| 2003/0110458 A1 | 6/2003 | Jain et al. | |
| 2003/0115317 A1 | 6/2003 | Hickson et al. | |
| 2003/0115347 A1 | 6/2003 | Wolrich et al. | |
| 2003/0115426 A1* | 6/2003 | Rosenbluth et al. | 711/154 |
| 2003/0120473 A1 | 6/2003 | Jain et al. | |
| 2003/0120884 A1* | 6/2003 | Koob et al. | 711/170 |
| 2003/0131022 A1 | 7/2003 | Wolrich et al. | |
| 2003/0131198 A1 | 7/2003 | Wolrich et al. | |
| 2003/0135351 A1 | 7/2003 | Wilkinson et al. | |
| 2003/0140196 A1 | 7/2003 | Wolrich et al. | |
| 2003/0144858 A1 | 7/2003 | Jain et al. | |
| 2003/0145155 A1 | 7/2003 | Wolrich et al. | |
| 2003/0145159 A1 | 7/2003 | Adiletta et al. | |
| 2003/0145173 A1 | 7/2003 | Wilkinson et al. | |
| 2003/0147409 A1 | 8/2003 | Wolrich et al. | |
| 2003/0150998 A1 | 8/2003 | Shin et al. | |
| 2003/0172313 A1 | 9/2003 | Jain et al. | |
| 2003/0191866 A1 | 10/2003 | Wolrich et al. | |
| 2003/0191988 A1 | 10/2003 | Dalal et al. | |
| 2003/0193936 A1 | 10/2003 | Wolrich et al. | |
| 2003/0196012 A1 | 10/2003 | Wolrich et al. | |
| 2003/0204394 A1 | 10/2003 | Garudadri et al. | |
| 2003/0204665 A1 | 10/2003 | Jain et al. | |
| 2003/0210574 A1 | 11/2003 | Wolrich et al. | |
| 2003/0212619 A1 | 11/2003 | Jain et al. | |
| 2003/0212852 A1 | 11/2003 | Wolrich et al. | |
| 2003/0219984 A1 | 11/2003 | Ying et al. | |
| 2003/0224811 A1 | 12/2003 | Jain et al. | |
| 2003/0225965 A1 | 12/2003 | Krishnan | |
| 2003/0233494 A1 | 12/2003 | Ghosh et al. | |
| 2003/0235189 A1 | 12/2003 | Mathew et al. | |
| 2004/0004970 A1 | 1/2004 | Lakshmanamuthy et al. | |
| 2004/0004972 A1 | 1/2004 | Lakshmanamurthy et al. | |
| 2004/0010791 A1 | 1/2004 | Jain et al. | |
| 2004/0012459 A1 | 1/2004 | Jain | |
| 2004/0032414 A1 | 2/2004 | Jain et al. | |
| 2004/0034743 A1 | 2/2004 | Wolrich et al. | |
| 2004/0039424 A1 | 2/2004 | Merritt et al. | |
| 2004/0039895 A1 | 2/2004 | Wolrich et al. | |
| 2004/0054880 A1 | 3/2004 | Bernstein et al. | |

| | | |
|---|---|---|
| 2004/0068614 A1 | 4/2004 | Rosenbluth et al. |
| 2004/0071152 A1 | 4/2004 | Wolrich et al. |
| 2004/0072563 A1 | 4/2004 | Holcman et al. |
| 2004/0073728 A1 | 4/2004 | Wolrich et al. |
| 2004/0073778 A1 | 4/2004 | Adiletta et al. |
| 2004/0073893 A1 | 4/2004 | Rajaram et al. |
| 2004/0078643 A1 | 4/2004 | Ghosh et al. |
| 2004/0081229 A1 | 4/2004 | Narayan et al. |
| 2004/0085901 A1 | 5/2004 | Hooper et al. |
| 2004/0093261 A1 | 5/2004 | Jain et al. |
| 2004/0093571 A1 | 5/2004 | Jain et al. |
| 2004/0093602 A1* | 5/2004 | Huston et al. ............... 718/107 |
| 2004/0098433 A1 | 5/2004 | Narayan et al. |
| 2004/0098496 A1 | 5/2004 | Wolrich et al. |
| 2004/0109369 A1 | 6/2004 | Wolrich et al. |
| 2004/0117239 A1 | 6/2004 | Mittal et al. |
| 2004/0117791 A1 | 6/2004 | Prasad et al. |
| 2004/0120359 A1 | 6/2004 | Frenzel et al. |
| 2004/0136445 A1 | 7/2004 | Olson et al. |
| 2004/0139290 A1 | 7/2004 | Wolrich et al. |
| 2004/0160290 A1 | 8/2004 | Jain et al. |
| 2004/0162083 A1 | 8/2004 | Chen et al. |
| 2004/0162933 A1 | 8/2004 | Adiletta et al. |
| 2004/0185868 A1 | 9/2004 | Jain et al. |
| 2004/0186921 A1 | 9/2004 | Wolrich et al. |
| 2004/0190905 A1 | 9/2004 | Jain |
| 2004/0199887 A1 | 10/2004 | Jain et al. |
| 2004/0203795 A1 | 10/2004 | Brusilovsky et al. |
| 2004/0203991 A1 | 10/2004 | Chen et al. |
| 2004/0205316 A1 | 10/2004 | Hooper et al. |
| 2004/0205569 A1 | 10/2004 | Jain et al. |
| 2004/0205747 A1 | 10/2004 | Bernstein et al. |
| 2004/0221066 A1 | 11/2004 | Ganfield et al. |
| 2004/0224666 A1 | 11/2004 | Jain et al. |
| 2004/0224667 A1 | 11/2004 | Jain |
| 2004/0225907 A1 | 11/2004 | Jain et al. |
| 2004/0230680 A1 | 11/2004 | Jain et al. |
| 2004/0252686 A1 | 12/2004 | Hooper et al. |
| 2004/0252711 A1 | 12/2004 | Romano et al. |
| 2005/0010761 A1 | 1/2005 | Remedios et al. |
| 2005/0018601 A1 | 1/2005 | Kalkunte et al. |
| 2006/0090044 A1* | 4/2006 | Hillier et al. ............... 711/155 |

OTHER PUBLICATIONS

Kumar, S., et al., "A Scalable, Cache-Based Queue Management Subsystem for Network Processors",Oct. 2004, pp. 1-7.*
Bill Carlson, "Packets challenge next-gen nets", 2002, EETIMES. □□http://www.eetimes.com/show/Article. jhtml;jsessionid—3FME3CRWBYX3KQSNDLPCKH0CJUNN2JVN?articleID=16505553.*
"Intel IXP1200 Network Processor Family—The Foundation of a Total Development Environment for Next-Generation Networks", *Prodcut Brief*, (2001),1-4.
"Intel IXP2400 Network Processor—For OC-48/2.5 Gbps network access and edge applications", *Product Brief*, (2002),1-6.
"Intel IXP2850 Network Processor—High-speed, secure content processing in a single chip", *Product Brief*, (2002),1-6.
Gene, C. , "DDR RAM", http://www.ccs.neu/course/com3200/parent/NOTES/DDR.hrml, (2003).
Tom, M. , "Are you ready for 64-bit PC", http://www.pcworld.com/article/id, 1/article.html,(Jul. 2003),111508.

* cited by examiner

US 7,418,543 B2

PROCESSOR HAVING CONTENT ADDRESSABLE MEMORY WITH COMMAND ORDERING

CROSS REFERENCE TO RELATED APPLICATIONS

Not Applicable.

STATEMENT REGARDING FEDERALLY SPONSORED RESEARCH

Not Applicable.

BACKGROUND

As is known in the art, network devices, such as routers and switches, can include network processors to facilitate receiving and transmitting data. In certain network processors, such as IXP Network Processors by Intel Corporation, high-speed queuing and FIFO (First In First Out) structures are supported by a descriptor structure that utilizes pointers to memory. U.S. Patent Application Publication No. US 2003/0140196 A1 discloses exemplary queue control data structures. Packet descriptors that are addressed by pointer structures may be 32-bits or less, for example.

In some known network processors, an operation that involves a read followed by write could result in loss of memory interface cycles. A read-modify-write (RMW) command enters a main command queue or FIFO (First In/First Out) 10 and is subsequently broken up into its constituent read and write commands. The read command is put into a read command FIFO and the write command is put into a write command FIFO. The queued write command must wait for the corresponding read command to finish before the required write data can be formed. If there is a backlog in the read command FIFO, the write FIFO stalls even if there is another write command pending in the write command FIFO that can execute. As a result write cycles are lost on the pin interface.

Similarly if there is a read that is ordered to a write location but write data has not yet been read from the source of the write data, the read can not proceed resulting in wasted read cycles. A similar loss of performance occurs when dealing with SRAM (static random access memory) ring commands.

BRIEF DESCRIPTION OF THE DRAWINGS

The exemplary embodiments contained herein will be more fully understood from the following detailed description taken in conjunction with the accompanying drawings, in which.

DETAILED DESCRIPTION

Figure 1:
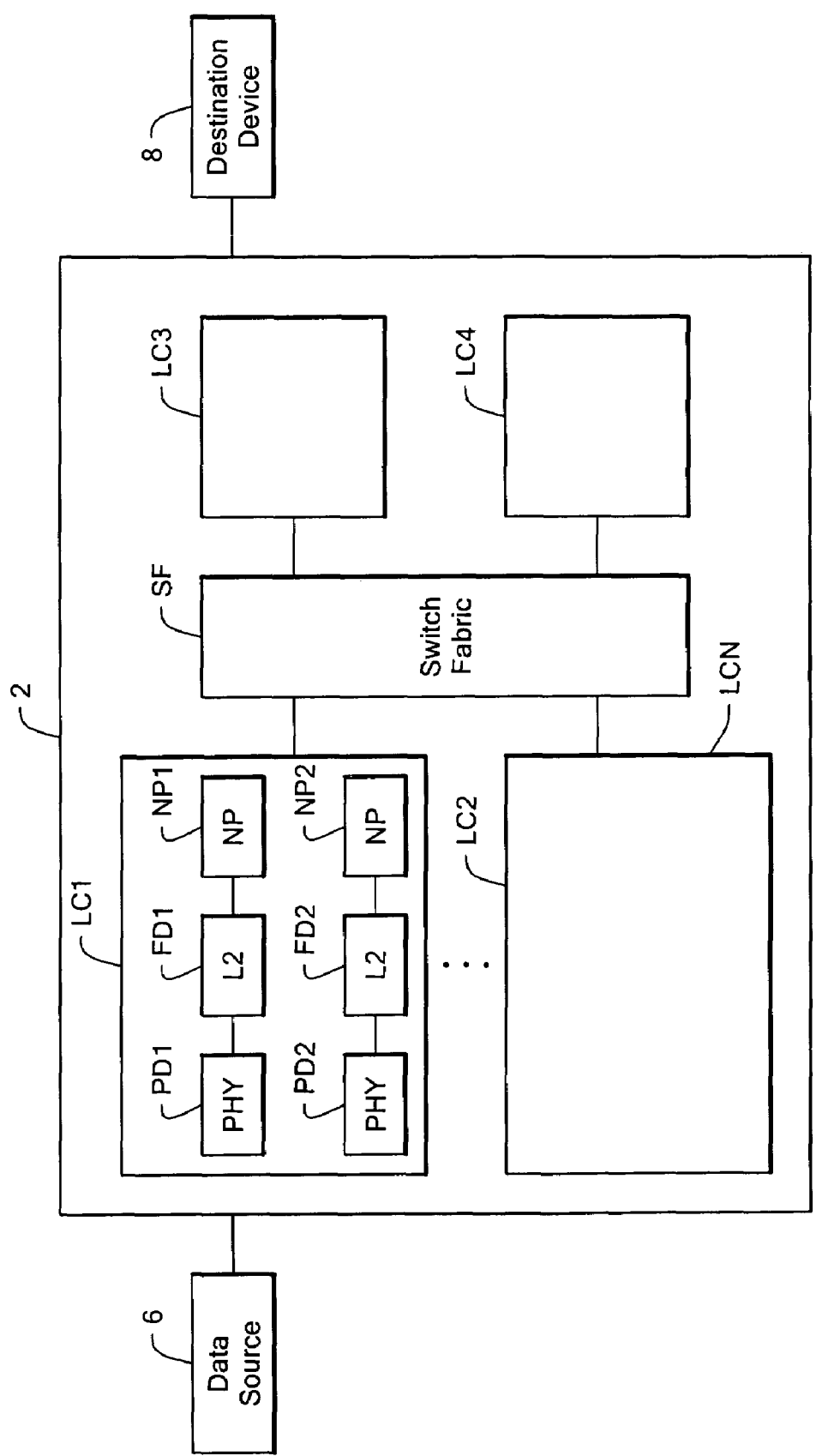
FIG. 1 is a diagram of an exemplary system including a network device having a network processor unit with a content addressable memory with a linked list pending queue to order memory commands.

FIG. 1 shows an exemplary network device 2 including network processor units (NPUs) having a content addressable memory with a linked list pending queue to order memory commands when processing incoming packets from a data source 6 and transmitting the processed data to a destination device 8. The network device 2 can include, for example, a router, a switch, and the like. The data source 6 and destination device 8 can include various network devices now known, or yet to be developed, that can be connected over a communication path, such as an optical path having a OC-192 line speed.

The illustrated network device 2 can manage queues and access memory as described in detail below. The device 2 features a collection of line cards LC1-LC4 ("blades") interconnected by a switch fabric SF (e.g., a crossbar or shared memory switch fabric). The switch fabric SF, for example, may conform to CSIX (Common Switch Interface) or other fabric technologies such as HyperTransport, Infiniband, PCI (Peripheral Component Interconnect), Packet-Over-SONET, RapidIO, and/or UTOPIA (Universal Test and Operations PHY Interface for ATM).

Individual line cards (e.g., LC1) may include one or more physical layer (PHY) devices PD1, PD2 (e.g., optic, wire, and wireless PHYs) that handle communication over network connections. The PHYs PD translate between the physical signals carried by different network mediums and the bits (e.g., "0"-s and "1"-s) used by digital systems. The line cards LC may also include framer devices (e.g., Ethernet, Synchronous Optic Network (SONET), High-Level Data Link (HDLC) framers or other "layer 2" devices) FD1, FD2 that can perform operations on frames such as error detection and/or correction. The line cards LC shown may also include one or more network processors NP1, NP2 that perform packet processing operations for packets received via the PHY(s) and direct the packets, via the switch fabric SF, to a line card LC providing an egress interface to forward the packet. Potentially, the network processor(s) NP may perform "layer 2" duties instead of the framer devices FD.

Figure 2:
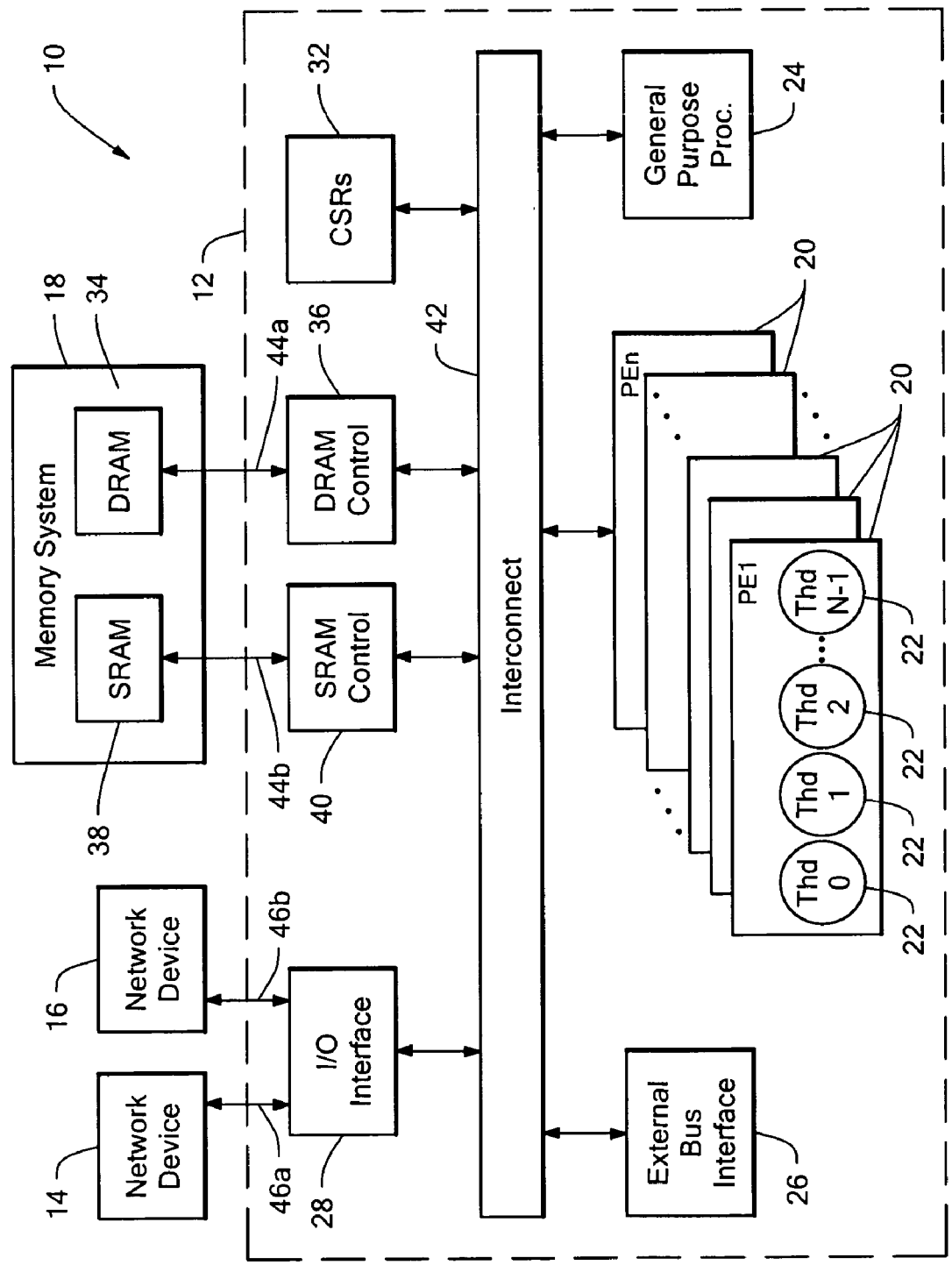
FIG. 2 is a diagram of an exemplary network processor having processing elements supporting a content addressable memory with a linked list pending queue to order memory commands.

FIG. 2 shows an exemplary system 10 including a processor 12, which can be provided as a multi-core, single-die network processor. The processor 12 is coupled to one or more I/O devices, for example, network devices 14 and 16, as well as a memory system 18. The processor 12 includes multiple processors ("processing engines" or "PEs") 20, each with multiple hardware controlled execution threads 22. In the example shown, there are "n" processing elements 20, and each of the processing elements 20 is capable of processing multiple threads 22, as will be described more fully below. In the described embodiment, the maximum number "N" of threads supported by the hardware is eight. Each of the processing elements 20 is connected to and can communicate with adjacent processing elements.

In one embodiment, the processor 12 also includes a general-purpose processor 24 that assists in loading microcode control for the processing elements 20 and other resources of the processor 12, and performs other computer type functions such as handling protocols and exceptions. In network processing applications, the processor 24 can also provide support for higher layer network processing tasks that cannot be handled by the processing elements 20.

The processing elements 20 each operate with shared resources including, for example, the memory system 18, an external bus interface 26, an I/O interface 28 and Control and Status Registers (CSRs) 32. The I/O interface 28 is responsible for controlling and interfacing the processor 12 to the I/O devices 14, 16. The memory system 18 includes a Dynamic Random Access Memory (DRAM) 34, which is accessed using a DRAM controller 36 and a Static Random Access Memory (SRAM) 38, which is accessed using an SRAM controller 40. Although not shown, the processor 12 also would include a nonvolatile memory to support boot operations. The DRAM 34 and DRAM controller 36 are typically used for processing large volumes of data, e.g., in network applications, processing of payloads from network packets. In a networking implementation, the SRAM 38 and SRAM controller 40 are used for low latency, fast access tasks, e.g., accessing look-up tables, and so forth.

The devices 14, 16 can be any network devices capable of transmitting and/or receiving network traffic data, such as framing/MAC (Media Access Control) devices, e.g., for connecting to 10/100 BaseT Ethernet, Gigabit Ethernet, ATM (Asynchronous Transfer Mode) or other types of networks, or devices for connecting to a switch fabric. For example, in one arrangement, the network device 14 could be an Ethernet MAC device (connected to an Ethernet network, not shown) that transmits data to the processor 12 and device 16 could be a switch fabric device that receives processed data from processor 12 for transmission onto a switch fabric.

In addition, each network device 14, 16 can include a plurality of ports to be serviced by the processor 12. The I/O interface 28 therefore supports one or more types of interfaces, such as an interface for packet and cell transfer between a PHY device and a higher protocol layer (e.g., link layer), or an interface between a traffic manager and a switch fabric for Asynchronous Transfer Mode (ATM), Internet Protocol (IP), Ethernet, and similar data communications applications. The I/O interface 28 may include separate receive and transmit blocks, and each may be separately configurable for a particular interface supported by the processor 12.

Other devices, such as a host computer and/or bus peripherals (not shown), which may be coupled to an external bus controlled by the external bus interface 26 can also be serviced by the processor 12.

In general, as a network processor, the processor 12 can interface to various types of communication devices or interfaces that receive/send data. The processor 12 functioning as a network processor could receive units of information from a network device like network device 14 and process those units in a parallel manner. The unit of information could include an entire network packet (e.g., Ethernet packet) or a portion of such a packet, e.g., a cell such as a Common Switch Interface (or "CSIX") cell or ATM cell, or packet segment. Other units are contemplated as well.

Each of the functional units of the processor 12 is coupled to an internal bus structure or interconnect 42. Memory busses 44a, 44b couple the memory controllers 36 and 40, respectively, to respective memory units DRAM 34 and SRAM 38 of the memory system 18. The I/O Interface 28 is coupled to the devices 14 and 16 via separate I/O bus lines 46a and 46b, respectively.

Figure 3:
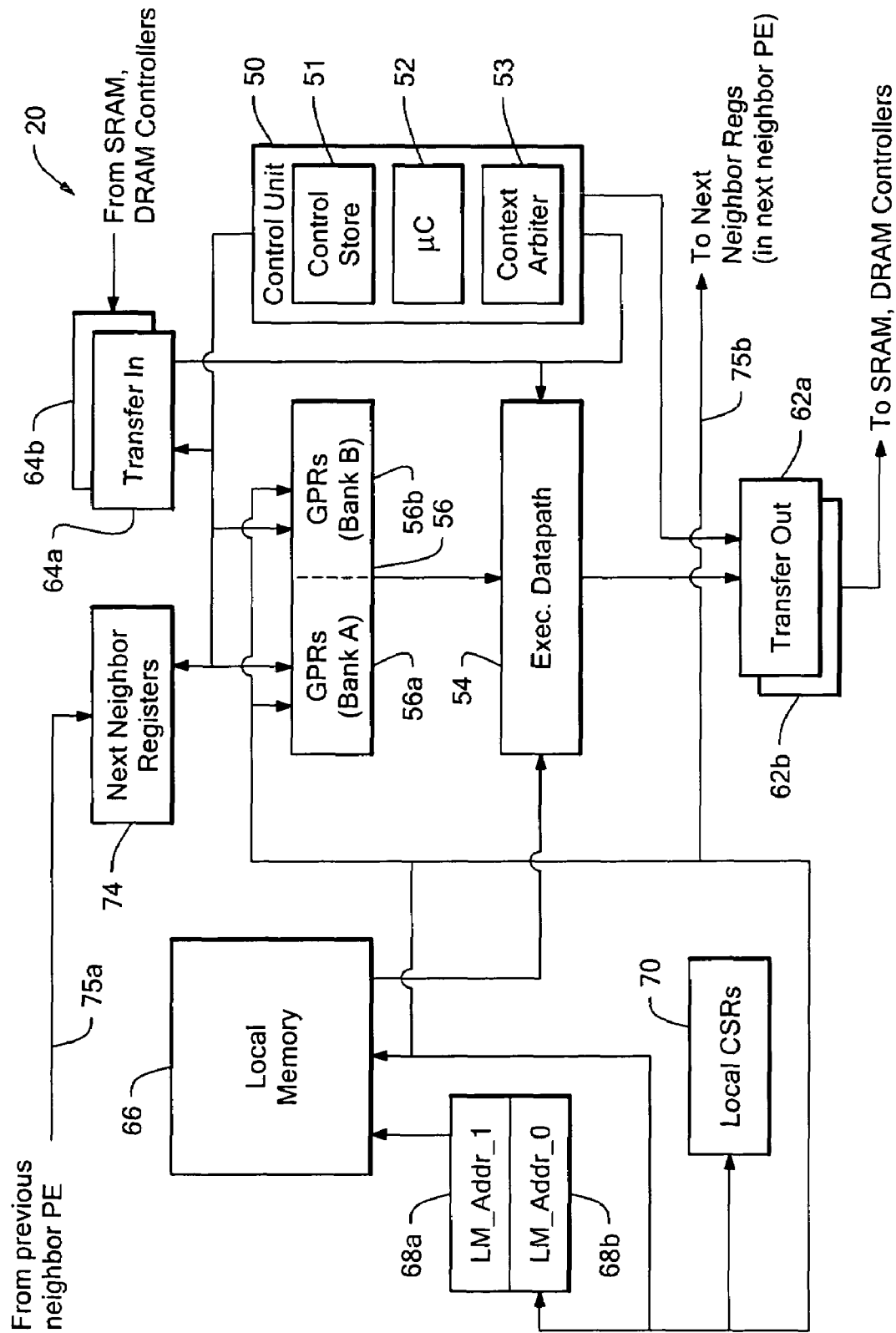
FIG. 3 is a diagram of an exemplary processing element (PE) that runs microcode.

Referring to FIG. 3, an exemplary one of the processing elements 20 is shown. The processing element (PE) 20 includes a control unit 50 that includes a control store 51, control logic (or microcontroller) 52 and a context arbiter/event logic 53. The control store 51 is used to store microcode. The microcode is loadable by the processor 24. The functionality of the PE threads 22 is therefore determined by the microcode loaded via the core processor 24 for a particular user's application into the processing element's control store 51.

The microcontroller 52 includes an instruction decoder and program counter (PC) unit for each of the supported threads. The context arbiter/event logic 53 can receive messages from any of the shared resources, e.g., SRAM 38, DRAM 34, or processor core 24, and so forth. These messages provide information on whether a requested function has been completed.

The PE 20 also includes an execution datapath 54 and a general purpose register (GPR) file unit 56 that is coupled to the control unit 50. The datapath 54 may include a number of different datapath elements, e.g., an ALU, a multiplier and a Content Addressable Memory (CAM).

The registers of the GPR file unit 56 (GPRs) are provided in two separate banks, bank A 56a and bank B 56b. The GPRs are read and written exclusively under program control. The GPRs, when used as a source in an instruction, supply operands to the datapath 54. When used as a destination in an instruction, they are written with the result of the datapath 54. The instruction specifies the register number of the specific GPRs that are selected for a source or destination. Opcode bits in the instruction provided by the control unit 50 select which datapath element is to perform the operation defined by the instruction.

The PE 20 further includes a write transfer (transfer out) register file 62 and a read transfer (transfer in) register file 64. The write transfer registers of the write transfer register file 62 store data to be written to a resource external to the processing element. In the illustrated embodiment, the write transfer register file is partitioned into separate register files for SRAM (SRAM write transfer registers 62a) and DRAM (DRAM write transfer registers 62b). The read transfer register file 64 is used for storing return data from a resource external to the processing element 20. Like the write transfer register file, the read transfer register file is divided into separate register files for SRAM and DRAM, register files 64a and 64b, respectively. The transfer register files 62, 64 are connected to the datapath 54, as well as the control store 50. It should be noted that the architecture of the processor 12 supports "reflector" instructions that allow any PE to access the transfer registers of any other PE.

Also included in the PE 20 is a local memory 66. The local memory 66 is addressed by registers 68a ("LM_Addr_1"), 68b ("LM_Addr_0"), which supplies operands to the datapath 54, and receives results from the datapath 54 as a destination.

The PE 20 also includes local control and status registers (CSRs) 70, coupled to the transfer registers, for storing local inter-thread and global event signaling information, as well as other control and status information. Other storage and functions units, for example, a Cyclic Redundancy Check (CRC) unit (not shown), may be included in the processing element as well.

Other register types of the PE 20 include next neighbor (NN) registers 74, coupled to the control store 50 and the execution datapath 54, for storing information received from a previous neighbor PE ("upstream PE") in pipeline processing over a next neighbor input signal 76a, or from the same PE, as controlled by information in the local CSRs 70. A next neighbor output signal 76b to a next neighbor PE ("downstream PE") in a processing pipeline can be provided under the control of the local CSRs 70. Thus, a thread on any PE can signal a thread on the next PE via the next neighbor signaling.

While illustrative hardware is shown and described herein in some detail, it is understood that the exemplary embodiments shown and described herein for a content addressable memory with a linked list pending queue to order memory commands are applicable to a variety of hardware, processors, architectures, devices, development systems/tools and the like.

In accordance with exemplary embodiments, a mechanism to order memory read and write commands includes a content addressable memory (CAM) and linked list pending queue to maximize memory channel bandwidth. In general, head of the line command blocking is reduced or eliminated with the use of a CAM and associated linked link logic.

Figure 4:
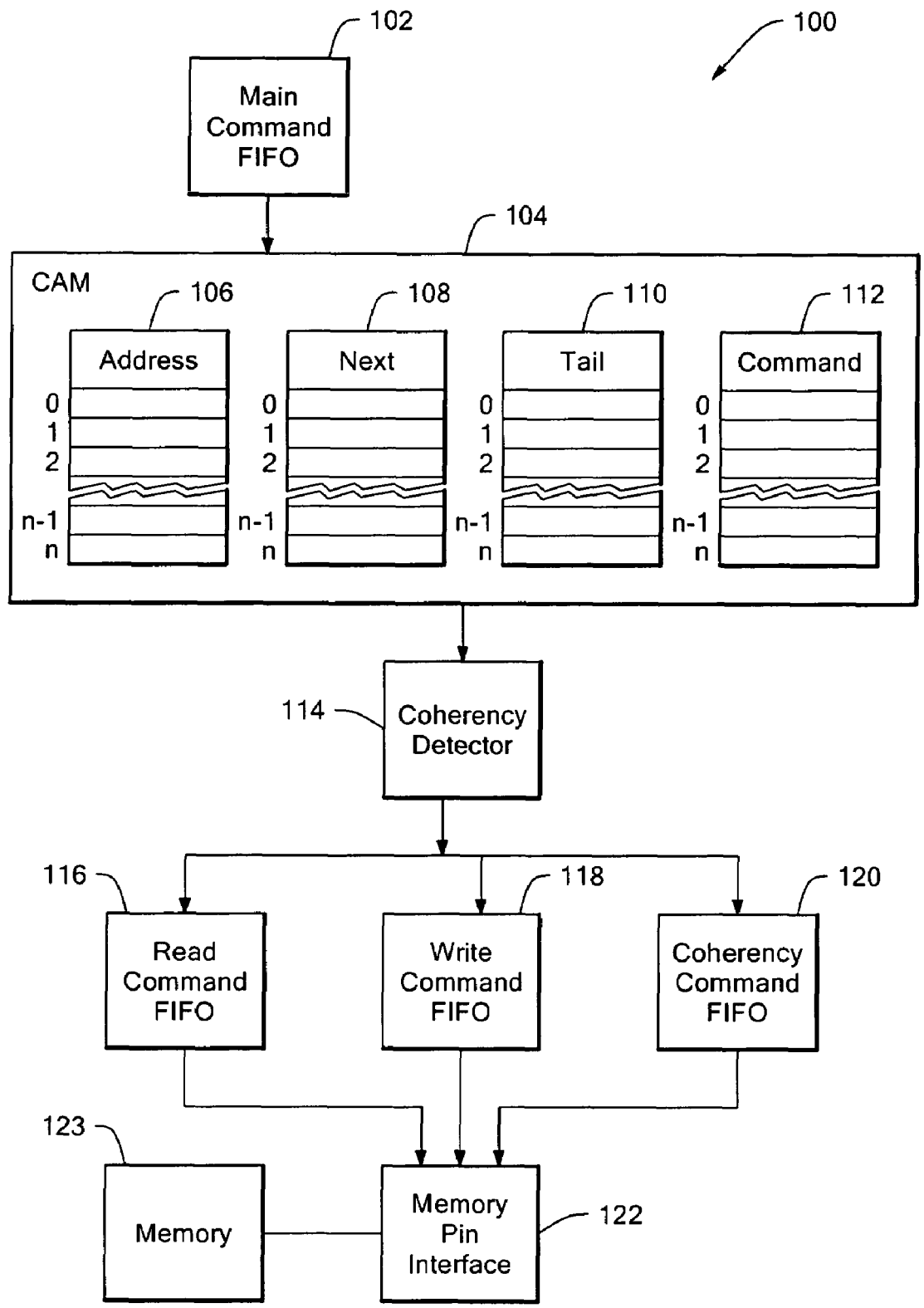
FIG. 4 is a diagram showing an exemplary command queuing implementation.

FIG. 4 shows an exemplary command storage configuration 100 including a main command FIFO 102 coupled to a CAM structure 104. In an exemplary embodiment, the CAM structure 104 includes an address field 106, a next pointer field 108, a tail pointer field 110, and a command storage field 112.

The CAM structure 104 is coupled to a coherency detector 114 that transmits commands to one of a read command FIFO 116, a write command FIFO 118, and a coherency FIFO 120. These FIFOs interact with a memory pin interface 122 to effect memory operations in a memory 123. The pin interface 122 maximizes access to the memory banks by keeping track of what memory banks are available since an access to a given memory bank may make the bank unavailable for the next cycle or several cycles. Accesses to the various memory banks should be distributed in time to maximize memory access efficiency. The attached memory can be a QDRII or QDRIII type of memories that have separate pins for address and data for different read and write operations or FCRAM (Fast Cycle Random Access Memory) type of memories which have shared read and write data pins but separate address pins. For example, a RMW command is received by the main command FIFO 102 and the address of the memory operation is stored in the CAM address field 104. The constituent read operation of the RMW command is launched to the pin interface 122. If, in the meantime, another command (e.g., read/write/RMW) is received that involves the same address, the command is stored in the CAM structure 104 by finding a free entry, invalidating it, and using its associated command storage field 112 to store the new command and connect it to the tail of linked list already attached to the hitting entry.

A received command that "hits" (e.g., matches an address in the CAM address field 106) in the CAM 104 or needs to use the CAM because of "read followed by write operation" uses a CAM entry. In one particular embodiment, all RMW commands are placed in the CAM 104 as well as commands that "hit" the cache due to an address match in the address field 106. For each CAM entry, the command is stored in the command storage field 112. A next descriptor field 108 and a tail descriptor field 110 are used to manage a linked list structure. The next field 108 points to the next entry in the link and the tail field 110 points to the last entry in the link. After data is returned by the pin interface 122, the linked list in the CAM 104 is processed with pending memory commands executed according to the command stored in the command storage 112.

In general, the coherency detector 114 and coherency command FIFO 120 provide a fence for RMW commands and commands that generate CAM hits. More particularly, non-RMW commands, e.g., read/write commands, for which a CAM hit does not occur are placed in the read command FIFO 116 or write command FIFO 118 as appropriate. Commands that must wait for other commands are place in the coherency command FIFO 120 to wait until a related command is completed. For example, when a RMW command is received, the read command can be launched to the pin interface 122 while the associated RMW command waits in the CAM to wait completion of the read operation. Upon completion of the read operation, the associated RMW command is invoked and modified data based on RMW command is written back to pin interface if no more commands exist in the link list. The write command goes into the write command FIFO 118. With this arrangement, normal read and write operations can still proceed while a RMW command is waiting for its read data.

Figure 5A:
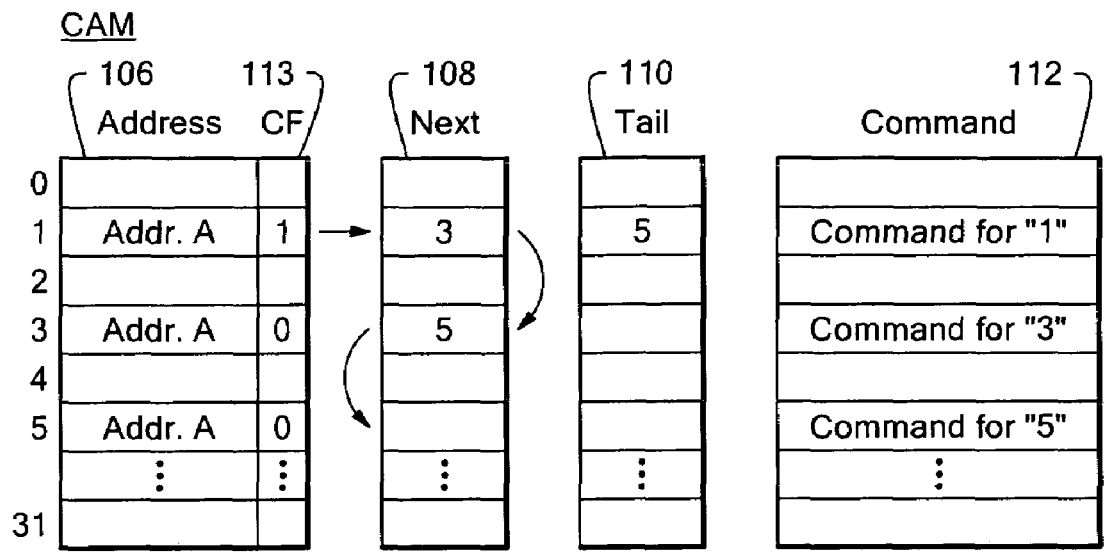
FIGS. 5A and 5B are pictorial representations of a CAM linked list structure.
Figure 5B:
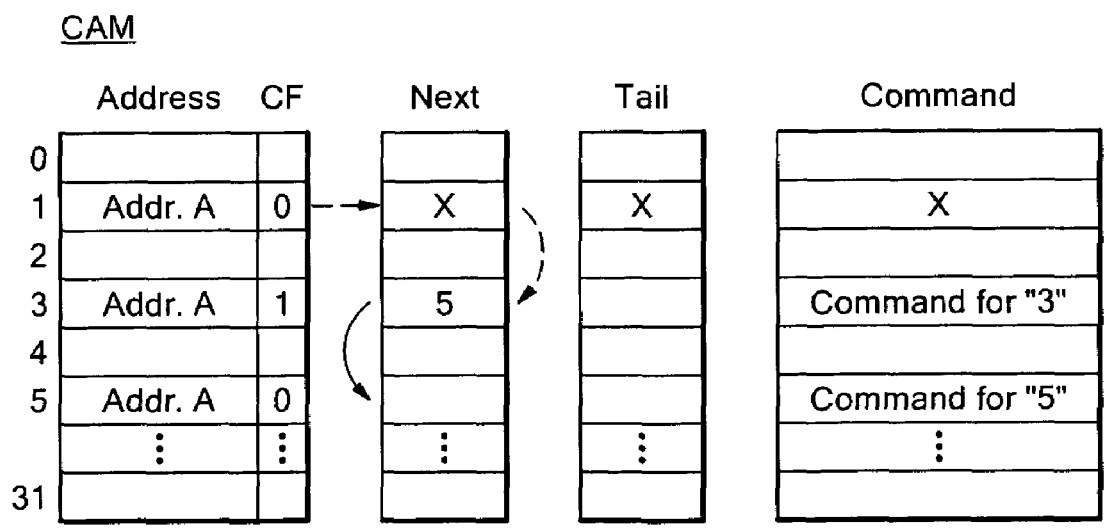

FIGS. 5A and 5B show an exemplary command processing sequence for the CAM structure 104 of FIG. 4, where like reference numbers indicate like elements. A first command is received for a RMW operation at address A. An empty location, e.g., location 1, in the CAM is found to store address A in the address field 106 and the first command is stored in the command field 112 for the CAM entry. The tail field 110 points to location 1 since there is only one command and the next field 108 is empty or don't care. When another command for address A is received there is a CAM hit. An available CAM entry, here shown as location 3, is found in which address A is stored. The next field 108 for CAM location 1 is updated to point to location 3 and the command is stored in the command field 112 for CAM location 3. The tail field 110 would also point to location 3.

Similarly, when the next operation for address A is received, another CAM hit occurs and a further available CAM location is identified, here shown as location 5. The command is stored in the command field 112 for CAM location 5. The tail field 110 for the first CAM location 1 is updated to reflect the last link as CAM location 5 and the next field 108 for CAM location 3 is updated to point to CAM location 5.

When processing the stored commands, initially a compare flag 113 is set for CAM location 1. This identifies CAM location 1 as the location containing the address to be checked against the address of new commands since the first command has not yet been processed. That is, the address in CAM location 1 is checked to determine CAM hits. After the first command has been processed, the compare flag 113 for the first CAM location 1 is cleared and the compare flag for CAM location 3 is set to indicate that location 3 should be used to determine CAM hits. Similarly, after the command for location 3 is processed, the compare flag 113 is cleared and the compare flag for CAM location 5 is set. Once this last command is processed, the compare flag 113 is cleared and no hits for address A will occur.

With this arrangement, processing is moved away from the pin interface 122 resulting in the collection of some commands in the link list. However, when the read/write operations of the first command in the link list complete, the remaining commands in the list can be serviced relatively quickly because the read data is already available. Read data can be kept in a temporary holding register for the time when pending operations on the same address A are completed.

Since coherency detection is performed again in the pin interface logic, there is no need to check for ordering requirements between "normal" reads and writes. In an exemplary embodiment, normal reads and writes are only tested with pending RMW operations and if there is no CAM hit, normal reads and writes proceed directly to the pin interface via the read and write FIFOS 116, 118 (FIG. 4).

While the exemplary embodiments are shown and described in conjunction with FIFOs, it is understood that other suitable queuing mechanisms will be readily apparent to one of ordinary skill in the art. It is further understood that a variety of CAM policies can be used of which least recently used (LRU) is but one example. In addition, while the CAM is shown having next and tail pointer fields, it is understood that other mechanisms can be used to provide a linked list configuration.

Figure 6:
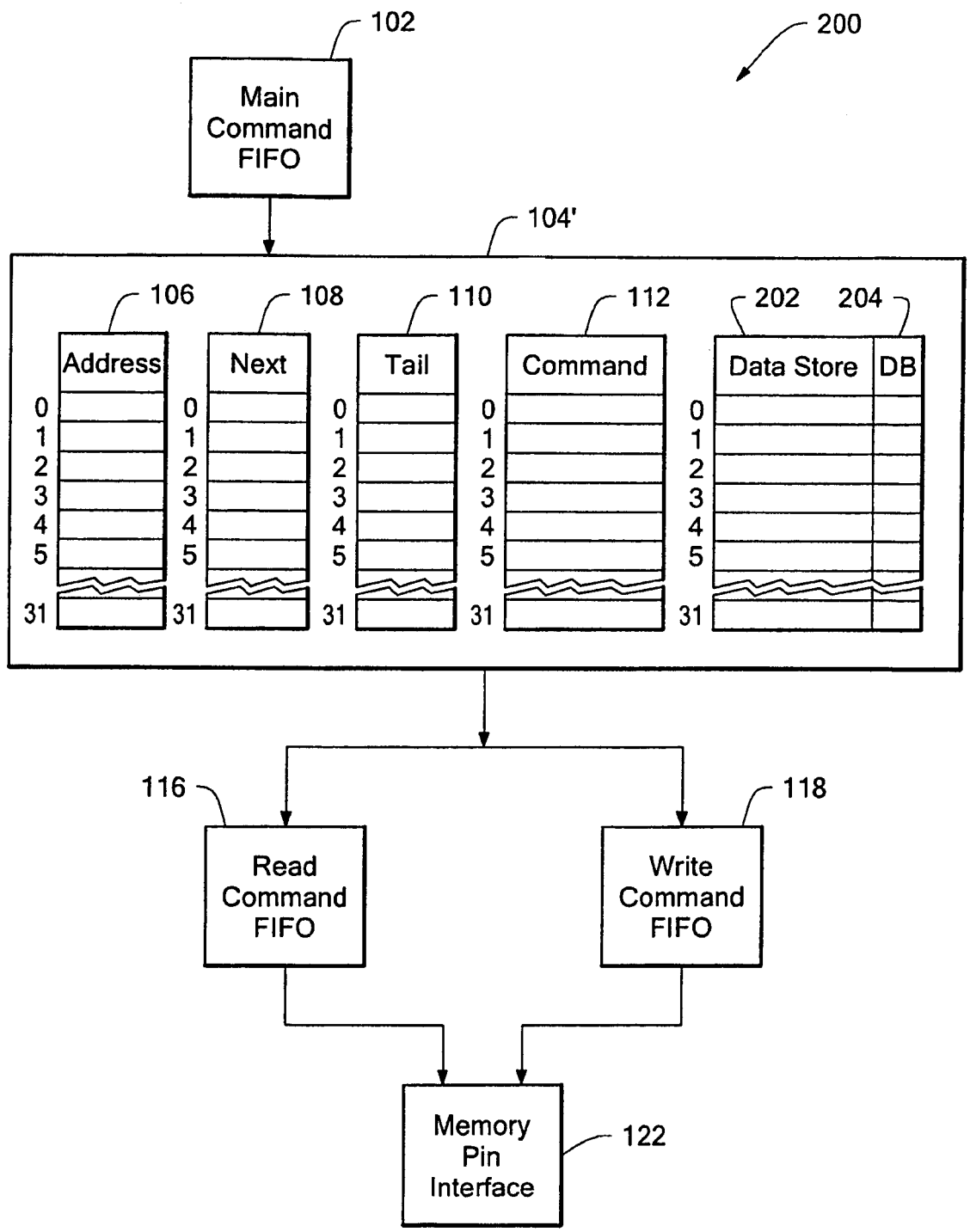
FIG. 6 is a block diagram of a command storage structure.

FIG. 6 shows an exemplary embodiment of a command storage configuration 200 including a CAM structure 104' in which coherency detection is removed from the pin interface 122 by including a data store with every CAM entry. This configuration 200 has some similarity with the configuration 100 of FIG. 4 in which like reference numbers indicate like elements. By including a data store field 202 in the configuration 200 of FIG. 6, the coherency detector 114 and FIFO 120 of FIG. 4 can be eliminated.

A read or write command at the head of the link list in the CAM 104' waits for an operation completed signal from pin interface logic 122 signaling that a write has completed or read data has been returned. After the operation completed signal is received, the pending commands for the same address can be serviced without requiring memory operations since the information resides in the data store field 202 of the CAM 104'. In one embodiment, where the last command is a write command the data should be written back to memory.

Assume a first command at the head of the queue is a write command, e.g., command AW, has been launched to the pin interface. Upon completion of the write operation, the pin interface generates a signal to indicate write completion. In the meantime, more commands for the same address BR (read), CW, DW, ER etc., are received. When the first write AW is completed, write data is still available in the data store field 202. For the second command BR, a read of the data just "written" can be serviced from the data store 202 without accessing the memory. The third command CW, a write to the same address, can also be serviced right away by replacing the data store field 202 with the CW data and setting a "dirty" bit 204 for the entry. It is understood that the "dirty" bit provides an indication of whether the write data has been written to memory. The fourth command DW, a write to the same location, can also be serviced right away by replacing the data store field 202 with the data for the fourth command DW. A fifth command ER, a read of the same location, can also be serviced right away using the data in the data store 202. If this is the last command in the CAM 104', based on the setting of the dirty bit, a write to memory is initiated. Upon receiving the write complete signal, the dirty bit 204 in the data store 202 is reset. If no more commands are pending on the same address, the CAM entry can be made eligible for replacement if more free entries are needed by CAM management.

It is understood that if the memory interface, such as QDR (quad data rate) SRAM, has separate read and write ports, then generic reads and writes should be ordered. The configuration of FIG. 6 can manage the coherency requirements for QDR memory operations. Alternatively, the configuration 100 of FIG. 4 can be used if coherency detection is performed in the pin interface logic.

It should be noted that if a CAM entry is never invalidated and maintains the last value locally (until a free CAM entry is needed to store a new command), then the CAM can also provide local caching so that a Read-Modify-Write operation for a 32-bit write on 64-bit accessible memory can be avoided. It is assumed that CAM management is defined such that an entry storing the 32-bit read command (with intention of 32-bit write back relatively soon) on 64-bit interface is made free only when no other type of CAM entry is available to store the newly received command needing the CAM entry. When the write for such an entry comes back and the entry is still valid, the data stored for the entry can be used to merge the received 32-bit data and written back as full 64-bit value as needed for a burst-of-4 memory interface.

Figure 7:
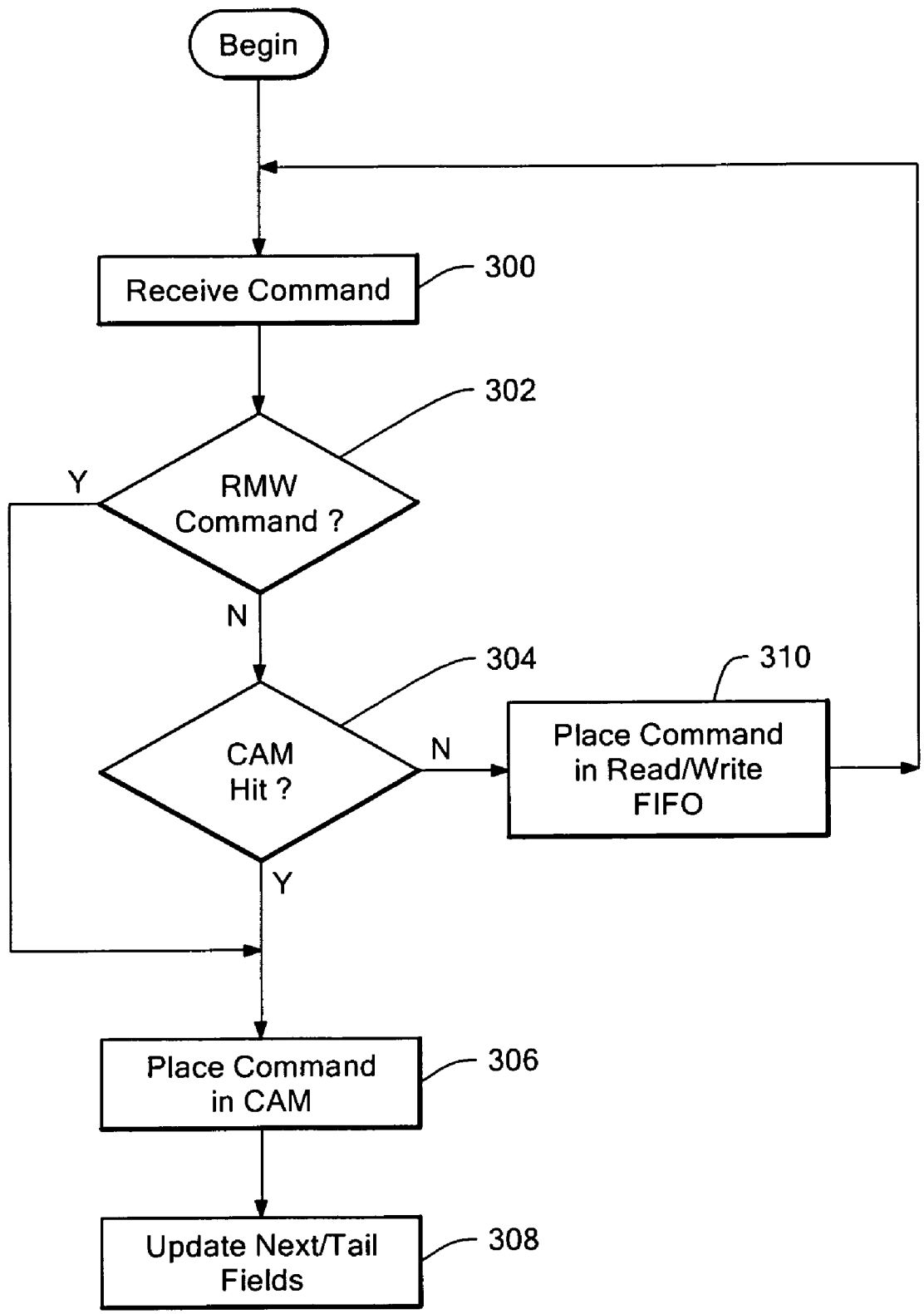
FIG. 7 is a flow diagram showing an exemplary processing sequence for received commands.

FIG. 7 is an exemplary processing sequence to implement a CAM with a linked list pending queue to order memory commands. In processing block 300, a first command is received. In processing decision block 302, it is determined whether the first command is a RMW write command. If so, the RMW command is placed in the CAM in processing block 306 and the next/tail fields are updated in processing block 308.

If the first command was not a RMW command as determined in block 302, in processing block 304 it is determined whether the first (non-RMW) command generates a CAM hit. A CAM hit is generated when a read/write command is for an address for which a command for that address is contained in the CAM. If there was not a CAM hit, the read/write command is placed in the read command FIFO or the write command FIFO as appropriate in processing block 310 and processing continues in processing block 300 as another command is received.

In parallel with the above, the linked list stored in the CAM is processed to execute the queued commands. As the CAM entries are processed, these CAM entries become available for other linked lists etc. It is understood that the CAM can hold multiple linked lists for multiple address locations.

Other embodiments are within the scope of the following claims.

What is claimed is:

1. A method of ordering memory commands, comprising:
   placing a portion of a received command for a first memory address into a first location of a content addressable memory (CAM) comprising an address field to store the first memory address, a first field, a second field and a command field to store the portion of the received command in a linked list structure;
   placing a first command for an address not contained in the CAM in a corresponding command queue;
   placing the portion of the received command in a coherency command queue configured to store commands waiting for related commands to be completed, the commands stored in the coherency command queue have addresses contained in the CAM;
   placing a second command for the first memory address in a command field of a second location of the CAM;
   updating the first field of the first CAM location to point to the second CAM location; and
   updating the second field of the first CAM location to point to the second CAM location.

2. The method according to claim 1, further comprising:
   placing a third command for the first memory address in a third location of the CAM;
   updating the second field of the first CAM location to point to the third CAM location; and
   updating the first field of the second CAM location to point to the third CAM location.

3. The method according to claim 1, wherein the received command is a read/modify/write (RMW) command, and
   placing the portion of the received command in a coherency command queue comprises placing a write command of the RMW command in the coherency command queue.

4. The method according to claim 3, further comprising waiting for a read command of the RMW command to complete before performing the write command of the RMW command stored in the coherency command queue.

5. The method according to claim 1 wherein placing a first command for an address not contained in the CAM in a corresponding command queue comprises placing a read command into a read command queue if the read command is for an address not contained in the CAM.

6. The method according to claim 1 wherein placing a first command for an address not contained in the CAM in a corresponding command queue comprises placing a write command into a write command queue if the write command is for an address not contained in the CAM.

7. The method according to claim 1, further including setting a flag for a first unprocessed command in the linked list of commands in the CAM.

8. The method according to claim 1, further including storing data associated with the received command in a data storage field of the CAM.

9. An article comprising:
a storage medium having stored thereon instructions executed by a machine, the instructions comprising instructions causing the machine to:
place a portion of a received command for a first memory address into a first location of a content addressable memory (CAM) comprising an address field to store the first memory address, a first field, a second field and a command field to store the portion of a received command in a linked list structure;
place a first command for an address not contained in the CAM in a corresponding command queue;
place the portion of the received command in a coherency command queue configured to store commands, waiting for related commands to be completed, the commands stored in the coherency command queue have addresses contained in the CAM;
place a second command for the first memory address in a command field of a second location of the CAM;
update the first field of the first CAM location to point to the second CAM location; and
update the second field of the first CAM location to point to the second CAM location.

10. The article according to claim 9, further comprising instructions causing a machine to:
place a third command for the first memory address in a third location of the CAM;
update the second field of the first CAM location to point to the third CAM location; and
update the first field of the second CAM location to point to the third CAM location.

11. The article according to claim 9, wherein the portion of the received command is a read/modify/write (RMW) command, and
wherein instructions causing a machine to place the portion of the received command in a coherency command queue comprise instructions causing a machine to place a write command of the RMW command in a coherency command queue.

12. The article according to claim 11 further comprising instructions causing a machine to wait for a read command of the RMW command to complete before performing the write command of the RMW command stored in the coherency command queue.

13. The article according to claim 9 wherein instructions causing a machine to place a first command for an address not contained in the CAM in a corresponding command queue comprises instructions causing a machine to place a read command into a read command queue if the read command is for an address not contained in the CAM.

14. The article according to claim 9, further including instructions to enable storing data associated with the received command in a data storage field of the CAM.

15. The article according to claim 9 wherein instructions causing a machine to place a command for an address not contained in the CAM in a corresponding command queue comprises instructions causing a machine to place a write command into a write command queue if the write command is for an address not contained in the CAM.

16. A processing unit, comprising:
a main command memory to store received memory commands;
a content addressable memory (CAM) including
an address field to store an address of a command;
a first field to point to a next command to be processed in a linked list of commands to be executed;
a second field to point to a last command in the linked list; and
a command field to store the command,
a read command memory configured to store a read command if the read command is for an address not contained in the CAM;
a write command memory configured to store a write command if the write command is for an address not contained in the CAM; and
a coherency command queue configured to store commands waiting for related commands to be completed, the commands stored in the coherency command queue have addresses contained in the CAM.

17. The processing unit according to claim 16, wherein the CAM further includes a data store field.

18. A network forwarding device, comprising:
at least one line card to forward data to ports of a switching fabric;
the at least one line card including a network processor having multi-threaded microengines configured to execute microcode resulting in the following:
placing a portion of a received command for a first memory address into a first location of a content addressable memory (CAM) comprising an address field to store the first memory address, a first field, a second field and a command field to store the portion of the received command in a linked list structure;
placing a first command for an address not contained in the CAM in a corresponding command queue;
placing the portion of the received command in a coherency command queue configured to store commands waiting for related commands to be completed, the commands stored in the coherency command queue have addresses contained in the CAM;
placing a second command for the first memory address in a command field of a second location of the CAM;
updating the first field of the first CAM location to point to the second CAM location; and
updating the second field of the first CAM location to point to the second CAM location.

19. The device according to claim 18, further comprising:
placing a third command for the first memory address in a third location of the CAM;
update the second field of the first CAM location to point to the third CAM location; and
update the first field of the second CAM location to point to the third CAM location.

20. The device according to claim 18, wherein the received command is a read/modify/write (RMW) command, and further including
wherein placing the portion of the received command in a coherency command queue configured to store commands, having addresses contained in the CAM, waiting for related commands to be completed comprises placing a write command of the RMW command in the coherency command queue.

21. The device according to claim 20, further including waiting for a read command of the RMW command to complete before performing the write for the RMW command.

22. The device according to claim 18 wherein placing a first command for an address not contained in the CAM in a corresponding command queue comprises placing a read command into a read command queue if the read command is for an address not contained in the CAM.

23. The device according to claim 18, further including storing data associated with the received command in a data storage field of the CAM.

24. A content addressable memory (CAM) structure comprising:
   fields, the fields comprising:
      a command field to store a portion of a received command; and
      an address field to store a memory address,
   wherein at least a portion of the fields are used in a linked list structure for links and a link includes CAM entries having an identical memory address stored in the address field,
   wherein the CAM is connected to a read command memory, a write command memory and a coherency command memory,
   wherein the command memory is configured to store commands waiting for related commands to be completed, the commands stored in the coherency command queue have addresses contained in the CAM;
   wherein the read command memory is configured to store a read command if the read command is for an address not contained in the CAM and the write command memory is configured to store a write command if the write command is for an address not contained in the CAM.

25. The CAM structure of claim 24 wherein the fields further comprise:
   a first pointer field to point to a next CAM entry in the link; and
   a second pointer field to point to a last CAM entry in the link.

* * * * *